United States Patent
Ogura et al.

(10) Patent No.: US 7,301,820 B2
(45) Date of Patent: Nov. 27, 2007

(54) NON-VOLATILE MEMORY DYNAMIC OPERATIONS

(75) Inventors: Seiki Ogura, Hillsboro, OR (US); Nori Ogura, Hillsboro, OR (US)

(73) Assignee: Halo LSI, Inc., Hillsboro, OR (US)

( * ) Notice: Subject to any disclaimer, the term of this patent is extended or adjusted under 35 U.S.C. 154(b) by 0 days.

(21) Appl. No.: 11/124,220

(22) Filed: May 6, 2005

(65) Prior Publication Data

US 2005/0254305 A1    Nov. 17, 2005

Related U.S. Application Data

(60) Provisional application No. 60/568,632, filed on May 6, 2004.

(51) Int. Cl.
*G11C 11/34* (2006.01)
*G11C 16/04* (2006.01)

(52) U.S. Cl. .......................... 365/185.26; 365/185.19; 365/185.28; 365/185.06

(58) Field of Classification Search ................. 365/185
See application file for complete search history.

(56) References Cited

U.S. PATENT DOCUMENTS 5,587,947 A * 12/1996 Chang et al. ............ 365/185.3
6,108,239 A * 8/2000 Sekariapuram et al. 365/185.28
6,114,724 A * 9/2000 Ratnakumar ................. 257/326
6,255,166 B1   7/2001 Ogura et al. ................. 438/257
6,459,622 B1 * 10/2002 Ogura et al. ........... 365/185.28
6,549,463 B2 *  4/2003 Ogura et al. ........... 365/185.18
6,873,550 B2 *  3/2005 Mihnea .................. 365/185.19
6,898,126 B1 *  5/2005 Yang et al. ............. 365/185.26

OTHER PUBLICATIONS

Ogura, et al. "Twin MONOS: a nitride based dual bit flash memory", Nov. 15-17, 2004, Non-Volatile Memory Technology Symposium, 2004, 157-160.*
Ogura, et al. "Twin MONOS cell with dual control gates", Jun. 13-15, 2000, Symposium on VLSI Technology, 2000, 122-123.*
Tatsuya Ishii, et al., "A 126.6 mm$^2$ AND-type 512 M6 Flash Memory with 1.8V Power Supply" *ISSCC* 2001.

* cited by examiner

*Primary Examiner*—Amir Zarabian
*Assistant Examiner*—Michael Weinberg
(74) *Attorney, Agent, or Firm*—Saile Ackerman LLC; Stephen B. Ackerman

(57) ABSTRACT

A dynamic programming method for a non-volatile storage device is described. Memory cells are provided arrayed in R rows. Sub bit lines are provided coupled to voltage supply lines through select circuits. During program operation, the select circuits are switched such that one or more of the source side sub bit line or the drain side sub bit line is floating when all other program voltages are applied to a selected cell.

11 Claims, 6 Drawing Sheets

NON-VOLATILE MEMORY DYNAMIC OPERATIONS

This application claims priority to U.S. Provisional Patent Application Ser. No. 60/568,632 filed on May 6, 2004, which is herein incorporated by reference in its entirety.

BACKGROUND OF THE INVENTION

1. Field of the Invention

The present invention relates to semiconductor memory and in particular to the dynamic operations for non-volatile memory.

2. Description of the Related Art

In conventional non-volatile flash memories, cells are erased on a block level and programmed on a bit level. Therefore, the threshold distributions of erased cells are typically wider than those of the programmed cells, as shown in FIG. 1A. As a result, cell currents of the erased cells may have significant variation, as shown in FIG. 1B. This variation of erased cell currents can be an issue in large arrays where many cells are read or programmed in parallel.

Dynamic Program has been discussed in Prior Art literature, Tatsuya Ishii, et. al., "A 126.6 mm2 AND-type 512 Mb Flash Memory with 1.8V Power Supply," *ISSCC* 2001. The memory cell featured in this paper is an assisted-gate AND type cell, which achieves high injection efficiency at low cell currents on the order of tens of nanoAmps. A schematic of a single column of memory cells is shown in FIG. 2. Sub bit-lines SBL[0] & SBL[1] are coupled to voltage sources VBL[0] and VBL[1] through select transistors gated by SG[0] and SG[1], respectively. Program voltages are shown for illustration. Timing of the signals SG[0], SG[1] and selected word line WL[0] are given in FIG. 3. In this approach, program voltages are first applied to the sub bit-lines through select transistors. The select transistors are then de-coupled so that the drain side bit-line is floating. After that, the word line is selected. Because the injection efficiency of the AND cell is high, the charge stored on the drain side bit line (BL) is sufficient to program the cell. The advantage of this dynamic program method is two-fold: (i) unlike typical CHE injection flash memories, DC current is not required during program, and (ii) threshold distribution of the cells programmed by the dynamic program method is tighter, because the amount of charge is fixed.

The Twin MONOS cell is introduced in U.S. Pat. No. 6,255,166 to Ogura et al, assigned to the same assignee as the present invention and herein incorporated by reference in its entirety. In the double-sided selection method, the pair of memory regions 602, 603 under a single control gate (CG) line is selected at the same time. A cross-section of the Twin MONOS cell and the voltage applied during read is given in FIG. 4A. The selected control gate is 802. Control gates 801 and 803 are unselected. The bit line source is 402 and the bit lines for sensing are 401 and 403.

Typical program voltages are shown in FIG. 4B. This type of memory cell has high injection efficiency at even lower voltages than the afore-mentioned AND cell. Because the AND cell stores charge 602, 603 on a floating gate, the coupling ratio is lower. During program, Twin MONOS cells require about 1V on the word gates 901 and 902, 5.5V applied to the selected CG side 802, 3.3V applied to the unselected CG side 801 and 803 to override the underlying memory state, and about 4V to the program side drain 402. Bit lines 401 and 403 provide the floating source, for example.

In the Twin MONOS program method, the low word gate voltage is the main method by which low cell current can be maintained during program. However, variations in word gate threshold voltage within an array can result in a distribution of program currents for the fixed word gate voltage. FIG. 5 shows a plot of cell currents vs. word gate voltage for an array of memory cells. At WG voltage=1V, all cell currents are less than 1 µA.

However, because of the very high injection efficiency, the final VT during program can be highly sensitive depending on array position. In the high density diffusion bit array, bit line resistance can become significant when many rows of memory cells are arrayed together.

SUMMARY OF THE INVENTION

The objective of this invention is to introduce a new method for dynamic program which addresses the issue of wide threshold distributions.

It is another objective of this invention to introduce a new method for dynamic read.

In accordance with the object of the invention, a programming method for a non-volatile storage device is achieved. Memory cells are provided arrayed in R rows. Sub bit lines are provided coupled to voltage supply lines through select circuits. During program operation, the select circuits are switched such that one or more of the source side sub bit line or the drain side sub bit line is floating when all other program voltages are applied to a selected cell.

Although this technique can be performed on any type of non-volatile memory cell, it will be explained by using Twin MONOS as the subject. It will be understood by those skilled in the art that the technique of the invention can be applied to any type of non-volatile memory cell without departing from the spirit and scope of the invention.

BRIEF DESCRIPTION OF THE DRAWINGS

In the accompanying drawings forming a material part of this description, there is shown:

FIGS. 7A through 7F show timing waveforms for several methods of switching related to BL and WL selection during program.

DESCRIPTION OF THE PREFERRED EMBODIMENT

Figure 1A:
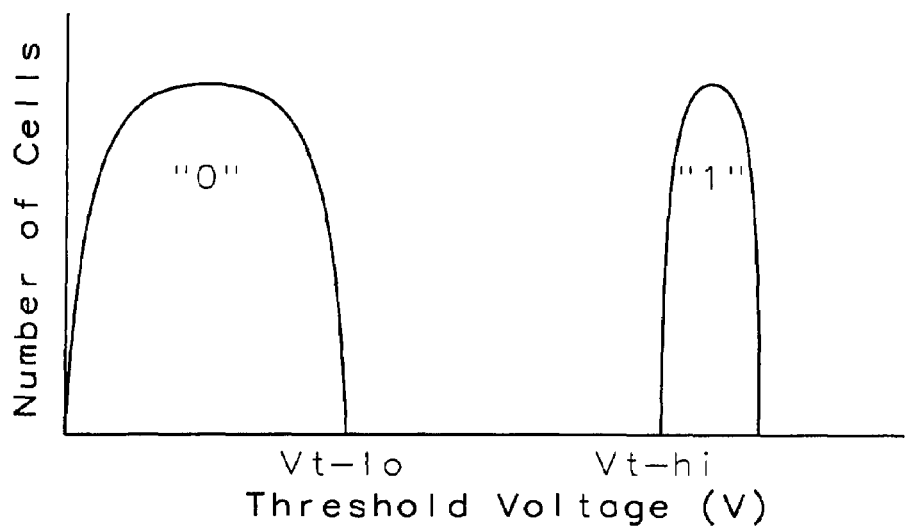
FIG. 1A is a graphical illustration of the threshold voltage distribution characteristics of typical non-volatile memory devices.
Figure 1B:
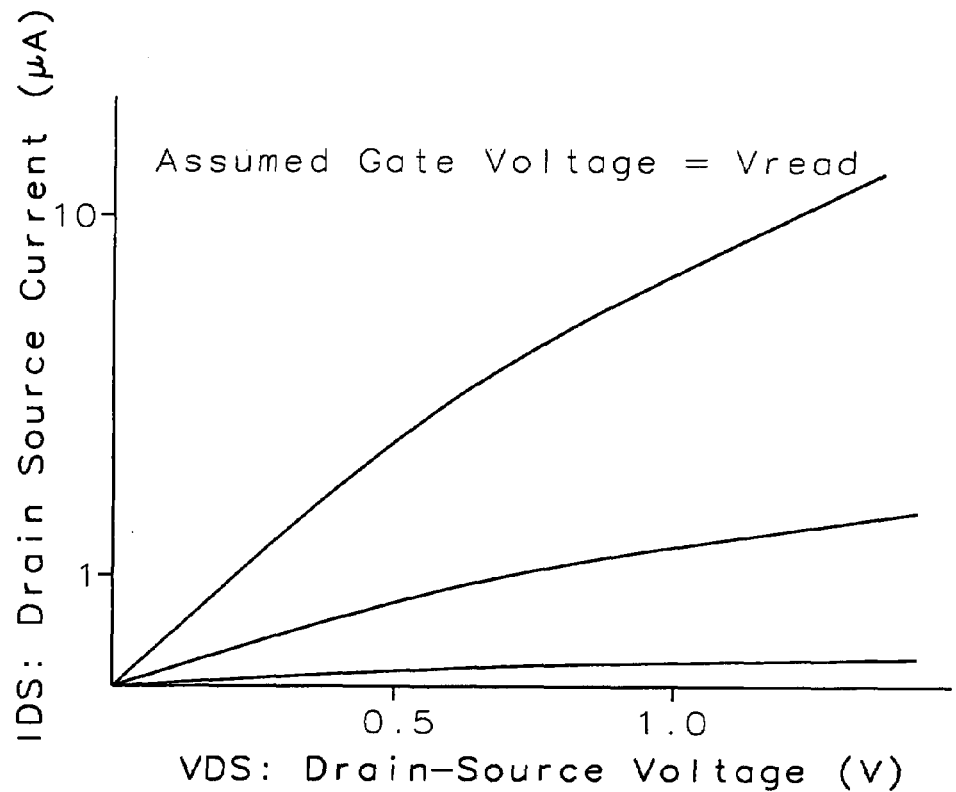
FIG. 1B is a graphical illustration of the current variation of typical non-volatile memory devices.
Figure 2:
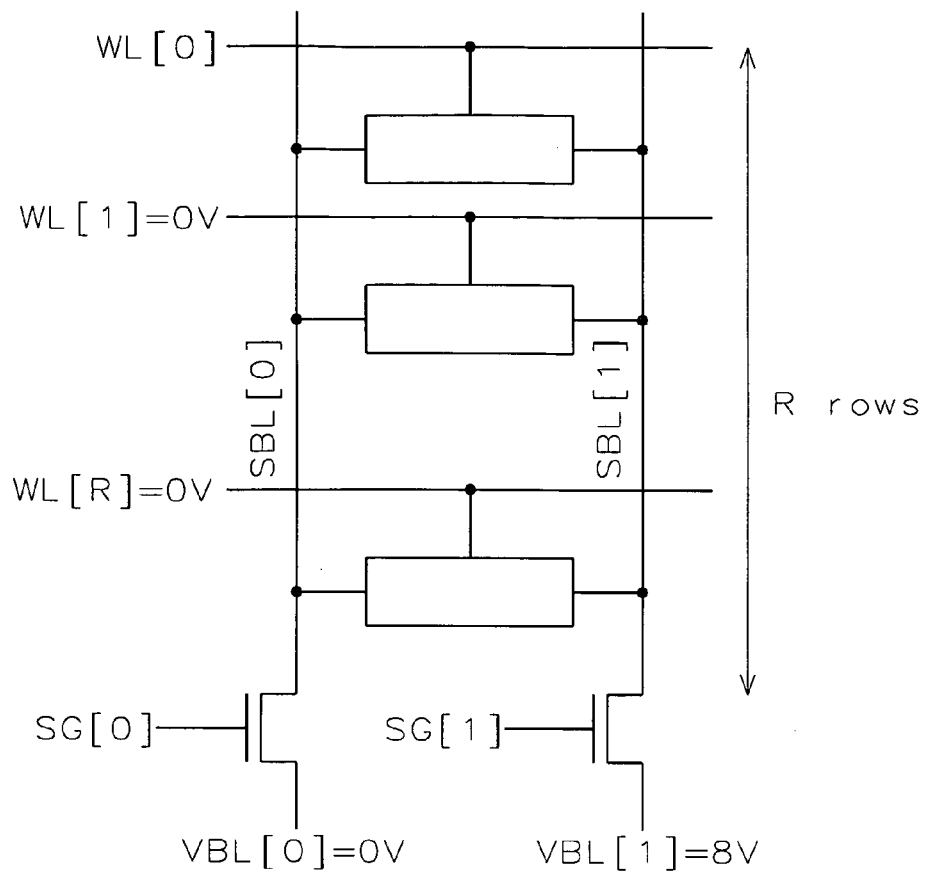
FIG. 2 is a schematic of a single column of Prior Art memory cells in an array with program operation voltage descriptions.
Figure 3:
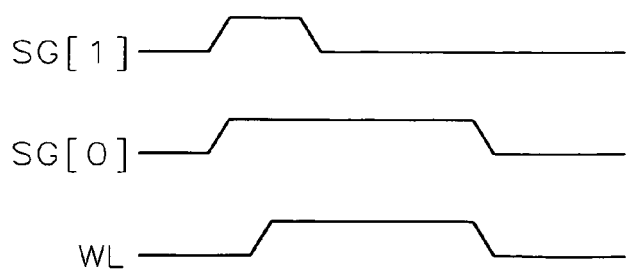
FIG. 3 is a timing diagram for switching BL and WL related voltages during program.
Figure 4A:
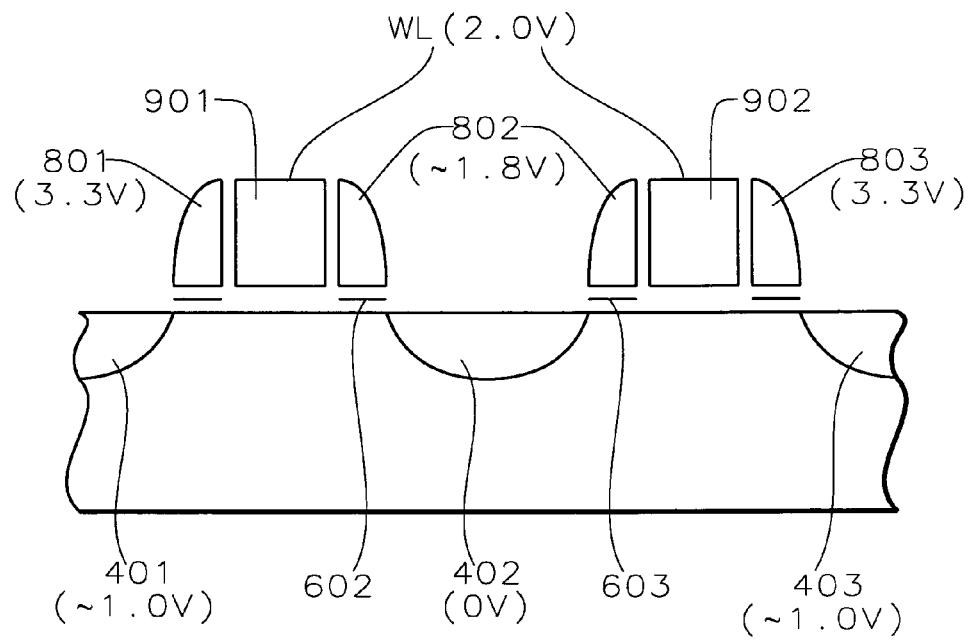
FIG. 4A shows read operation voltages applied to a cross-section of a Twin MONOS memory.
Figure 4B:
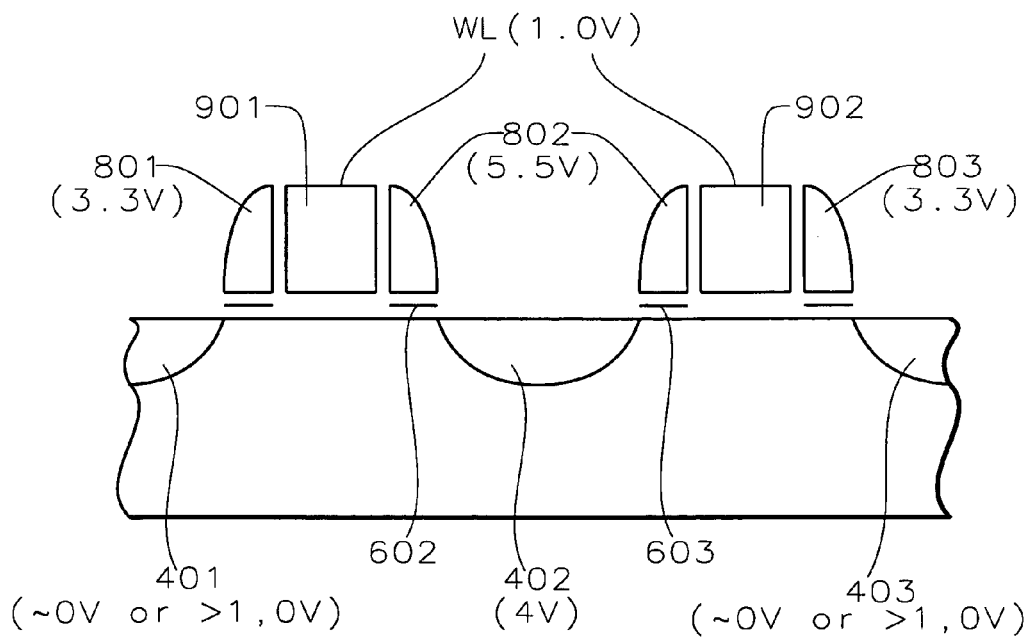
FIG. 4B shows program operation voltages applied to a cross-section of a Twin MONOS memory.
Figure 5:
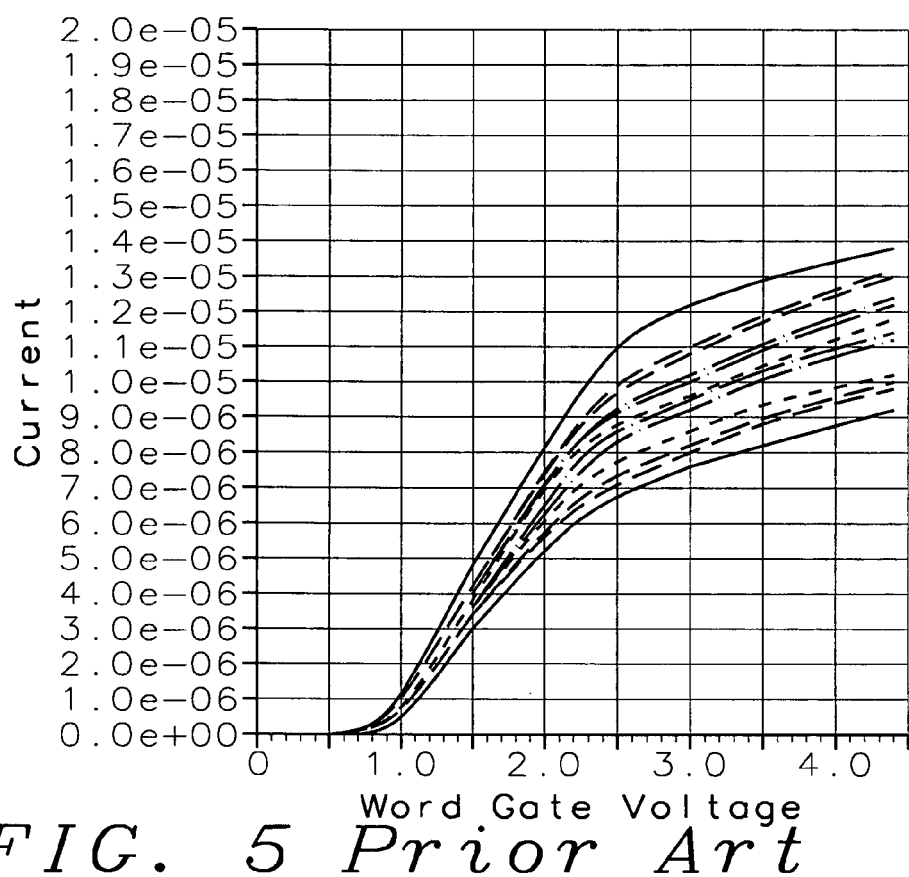
FIG. 5 graphically illustrates word gate cell current vs. word gate voltage for an array of Twin MONOS devices.
Figure 6:
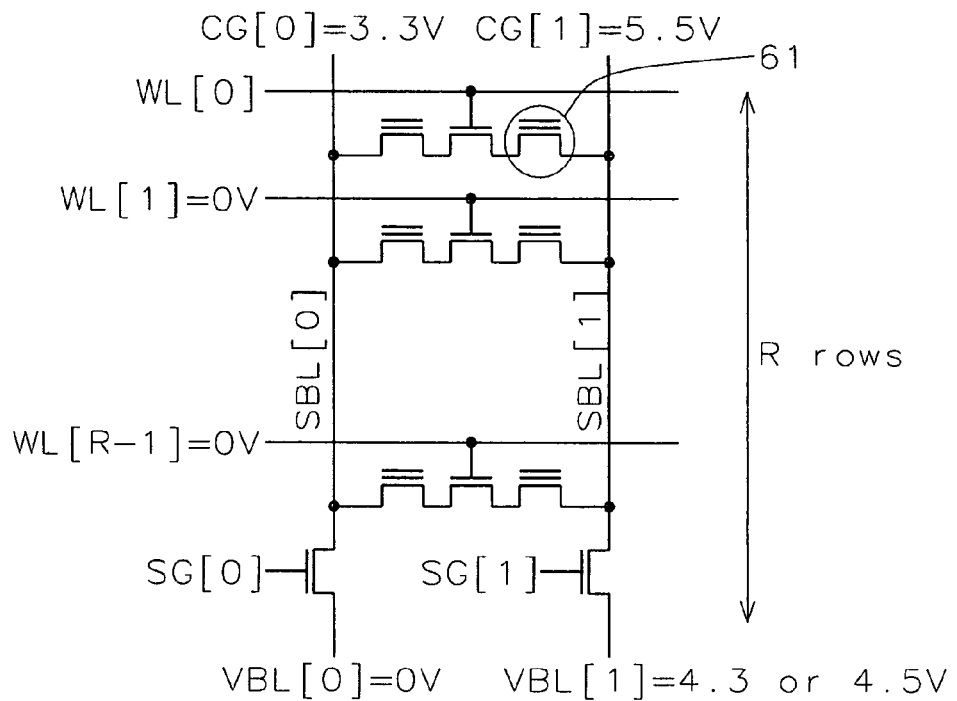
FIG. 6 shows a schematic of a single column of Twin MONOS memory cells from a diffusion bit array, with the fixed program voltages.
Figure 7A:
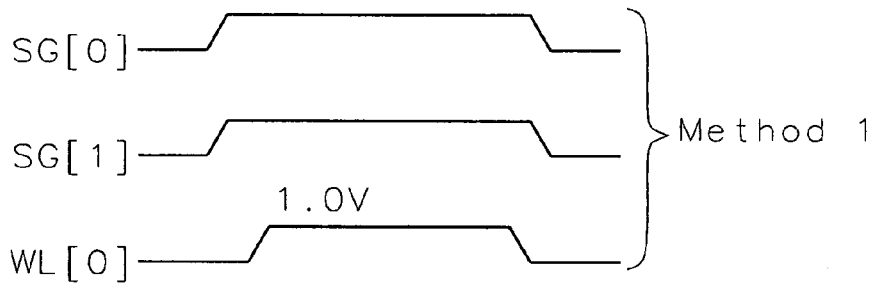
Figure 7B:
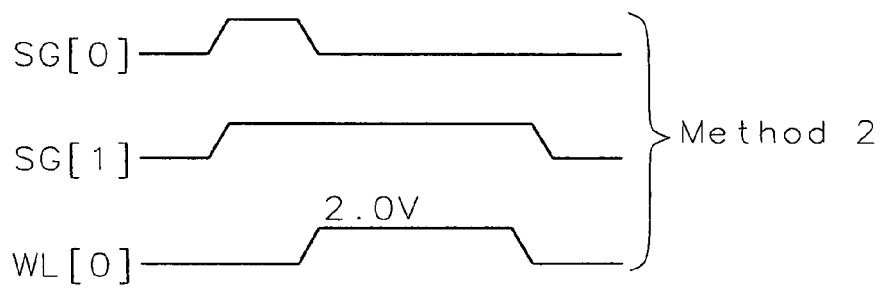

FIG. 6 gives a schematic of a single column of Twin MONOS cells in a diffusion bit array, such as is shown in cross-section in FIG. 4B. R is the number of rows between select gates. Sub bit-lines SBL[0] & SBL[1] are coupled to main bit lines or voltage sources VBL[0] and VBL[1] through select transistors gated by SG[0] and SG[1], respectively. The selected cell 61 is illustrated. The voltages applied during program are given: the drain side sub bit line (402 in FIG. 4B) associated with the selected control gate (802) is 4.3V or 4.5V, and preferably 4.5V, the source side sub bit line (401) of the unselected control gate (801) opposite the selected control gate (802) is 0V, the selected control gate CG[1] (802) is 5.5V, and the override side unselected control gate CG[0] (801) is 3.3V. Timing for the select transistors gated by SG[0] and SG[1] as well as the selected WL[0] is given in FIGS. 7A and 7B. Two methods are compared. Method 1, illustrated in FIG. 7A, is the conventional fixed voltage method, whereas in Method 2, illustrated in FIG. 7B, the source side sub bit line is floated during program. In Method 2, the word gate voltage is a little higher than in Method 1.

Figure 8:
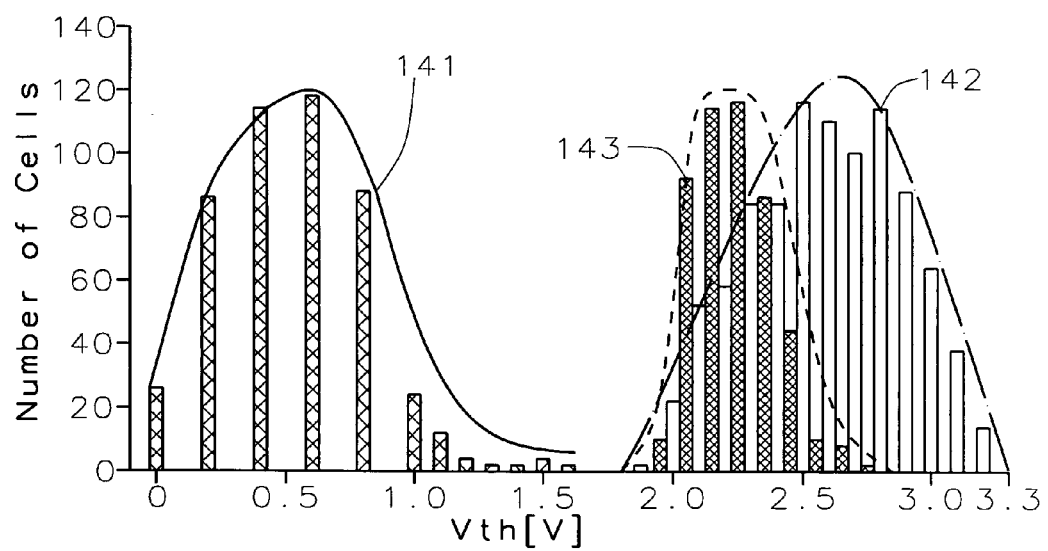
FIG. 8 graphically illustrates a comparison between the two timing methods given in FIGS. 7A and 7B.

FIG. 8 gives program distributions when R=128 as a result of the two methods. 141 denotes the initial condition. The conventional method 142 (illustrated in FIG. 7A) has much wider threshold variation after program. Method 2's threshold distribution 143 (illustrated in FIG. 7B) is more narrow, because the program operation is self-limiting. As charge flows from the drain sub bit line to the source sub bit line, the source sub bit line voltage will float up and stop injecting electrons into the cell.

Other variations to Method 2 could be to float the drain side sub-bit line instead of the source side sub-bit line during program, as illustrated in the timing diagram FIG. 7C, or even to float them both, as illustrated in the timing diagram FIG. 7D. Also, staggering the switching of these voltages from floating to non-floating can provide an additional advantage of controlling the peak current. Either the source side or drain side sub-bit line or both can be switched from non-floating to floating or from floating to non-floating, as illustrated in FIG. 7E. Optionally, any of these sub-bit lines can be switched back to non-floating again, or back to floating, as illustrated in FIG. 7F.

Figure 9:
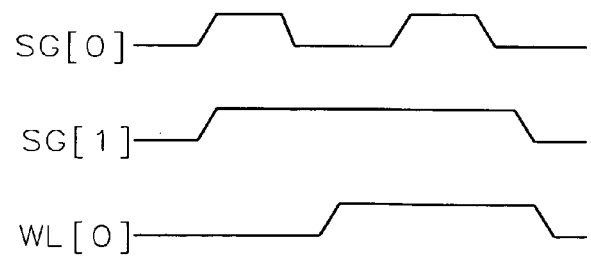
FIG. 9 shows another timing method.

Method 3, given by FIG. 9, gives an illustration. Here, in addition to the dynamic program Method 1, the floating source sub bit line is connected to ground again once more during program.

Applying the concept of dynamic source line switching to read operation could also be useful when the data width is very wide and the IR drop of the source line voltage is significant. Some signal margin may be lost because the source line voltage might float up. But this concept addresses the issue of variation as a function of array position.

While the invention has been particularly shown and described with reference to preferred embodiments thereof, it will be understood by those skilled in the art that various changes in form and details may be made without departing from the spirit and scope of the invention.

What is claimed is:

1. A programming method for a non-volatile storage device comprising:
    providing twin MONOS memory cells between a source side sub bit line and a drain side sub bit line coupled to voltage supply lines through select circuits in an array wherein each memory cell comprises a word gate and a pair of associated control gates; and
    during program operation, switching said select circuits to select and program a cell such that one of the source side sub bit line or the drain side sub bit line is floating when program voltages are applied to a selected control gate and an unselected control gate of a selected memory cell.

2. The programming method according to claim 1 wherein said program voltages applied during program comprise:
    applying 4.3V to the selected-drain side sub bit line;
    applying 0V to the source side sub bit line;
    applying 5.5V to said selected control gate; and
    applying 3.3V to said unselected control gate.

3. A programming method for a non-volatile storage device comprising:
    providing twin MONOS memory cells between a source side sub bit line and a drain side sub bit line coupled to voltage supply lines through select circuits in an array wherein each memory cell comprises a word line and a pair of associated control gates; and
    during program operation, switching said select circuits to select and program a cell such that the source side sub bit line is floating when program voltages are applied to a selected control gate and an unselected control gate of a selected memory cell.

4. The programming method according to claim 3 wherein said program voltages applied during program comprise:
    applying 4.3V to the drain side sub bit line;
    applying 0V to the source side sub bit line;
    applying 5.5V to said selected control gate; and
    applying 3.3V to said unselected control gate.

5. A channel hot electron programming method for a non-volatile storage device comprising:
    providing twin MONOS memory cells between a source side sub bit line and a drain side sub bit line coupled to voltage supply lines through select circuits wherein said memory cells are arrayed in R rows wherein each memory cell comprises a word line and a pair of associated control gates; and
    during program operation, switching said select circuits to select and program a cell such that at least one of the source side sub bit line or the drain side sub bit line is floating when program voltages are applied to a selected control gate and an unselected control gate of a selected said memory cell.

6. The programming method according to claim 5 wherein said program voltages applied during program comprise:
    applying 4.5V to the drain side sub bit line;
    applying 0V to the source side sub bit line;
    applying 5.5V to said selected control gate; and
    applying 3.3V to said unselected control gate.

7. The programming method according to claim 5 wherein both said source side sub bit line and said drain side sub bit line are floating.

8. The programming method according to claim 5 wherein only one of said source side sub bit line and said drain side sub bit line is floating.

9. The programming method according to claim 5, wherein, during said programming, both said source side sub bit line and said drain side sub bit line are switched from floating to non-floating or from non-floating to floating and wherein switching of said source side sub bit line is at a different timing than switching of said drain side sub bit line.

10. The programming method according to claim 9, wherein said source side sub bit line and said drain side sub bit line are switched back to said floating state or to said non-floating state wherein switching of said source side sub bit line is at a different timing than switching of said drain side sub bit line.

11. The programming method according to claim 8 further comprising connecting said floating one of said source side sub bit line or said drain side sub bit line to ground a time period after said programming begins.

* * * * *